(12) United States Patent
Sakai

(10) Patent No.: US 6,404,359 B1
(45) Date of Patent: Jun. 11, 2002

(54) VARIABLE LENGTH DECODING SYSTEM HAVING A MASK CIRCUIT FOR IMPROVED CACHE HIT ACCURACY

(75) Inventor: Katsumi Sakai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/580,129

(22) Filed: May 30, 2000

(30) Foreign Application Priority Data

May 27, 1999 (JP) ............................................ 11-148577

(51) Int. Cl.[7] ................................................ H03M 7/40
(52) U.S. Cl. ............................ 341/67; 341/50; 711/109
(58) Field of Search ............................ 341/67, 65, 50; 711/109; 395/164, 386

(56) References Cited

U.S. PATENT DOCUMENTS

| | | | | |
|---|---|---|---|---|
| 5,559,952 A | * | 9/1996 | Fujimoto | 345/557 |
| 5,638,067 A | * | 6/1997 | Brent | 341/67 |
| 5,642,114 A | * | 6/1997 | Komoto et al. | 341/67 |
| 5,860,086 A | * | 1/1999 | Crump et al. | 711/109 |
| 5,870,576 A | * | 2/1999 | Faraboschi et al. | 712/210 |

FOREIGN PATENT DOCUMENTS

| | | | |
|---|---|---|---|
| JP | 2-2350 | 1/1990 | H04N/1/419 |
| JP | 9-185548 | 7/1997 | G06F/12/08 |

* cited by examiner

*Primary Examiner*—Peguy JeanPierre
(74) *Attorney, Agent, or Firm*—Scully, Scott, Murphy & Presser

(57) ABSTRACT

In a decoding system having a cache memory, for decoding a variable length code such as a MH code, the decoding is carried out by accessing the cache memory by using a variable length code as an address. Whether the cache memory is hit or mishit is judged by discriminating whether or not the code bits of the 7 bits succeeding to the firstly appeared "1" in the actual code is coincident with the tag stored in the cache memory. This comparison is carried out by masking bits other than an effective bit length of the actual code, by utilizing the three-bit information indicating the number of remaining bits in the actual code, succeeding to the firstly appeared "1", outputted from the cache memory. Thus, the decoding system is capable of elevating the hit rate of the cache memory.

4 Claims, 9 Drawing Sheets

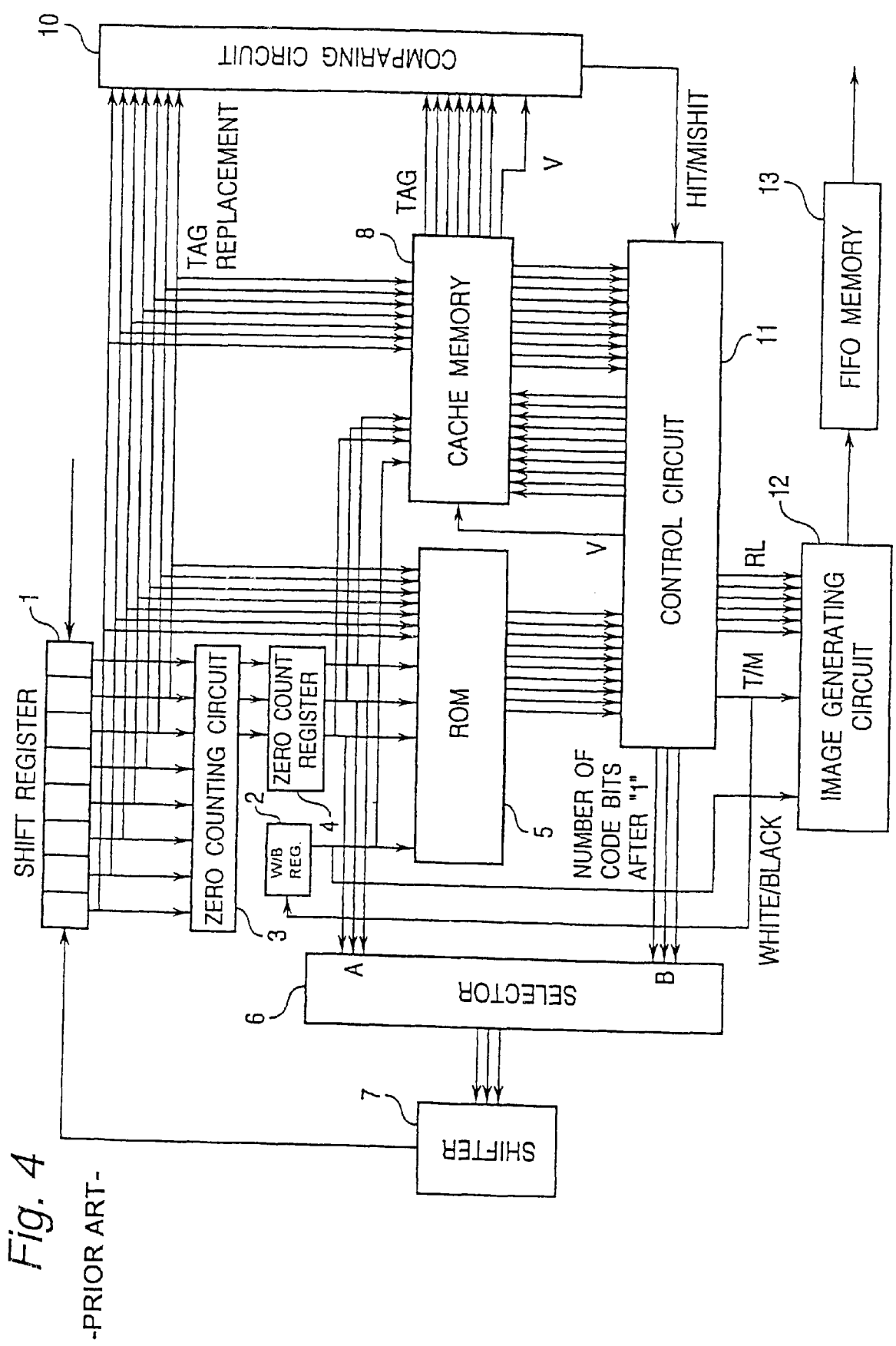
Fig. 4 -PRIOR ART-

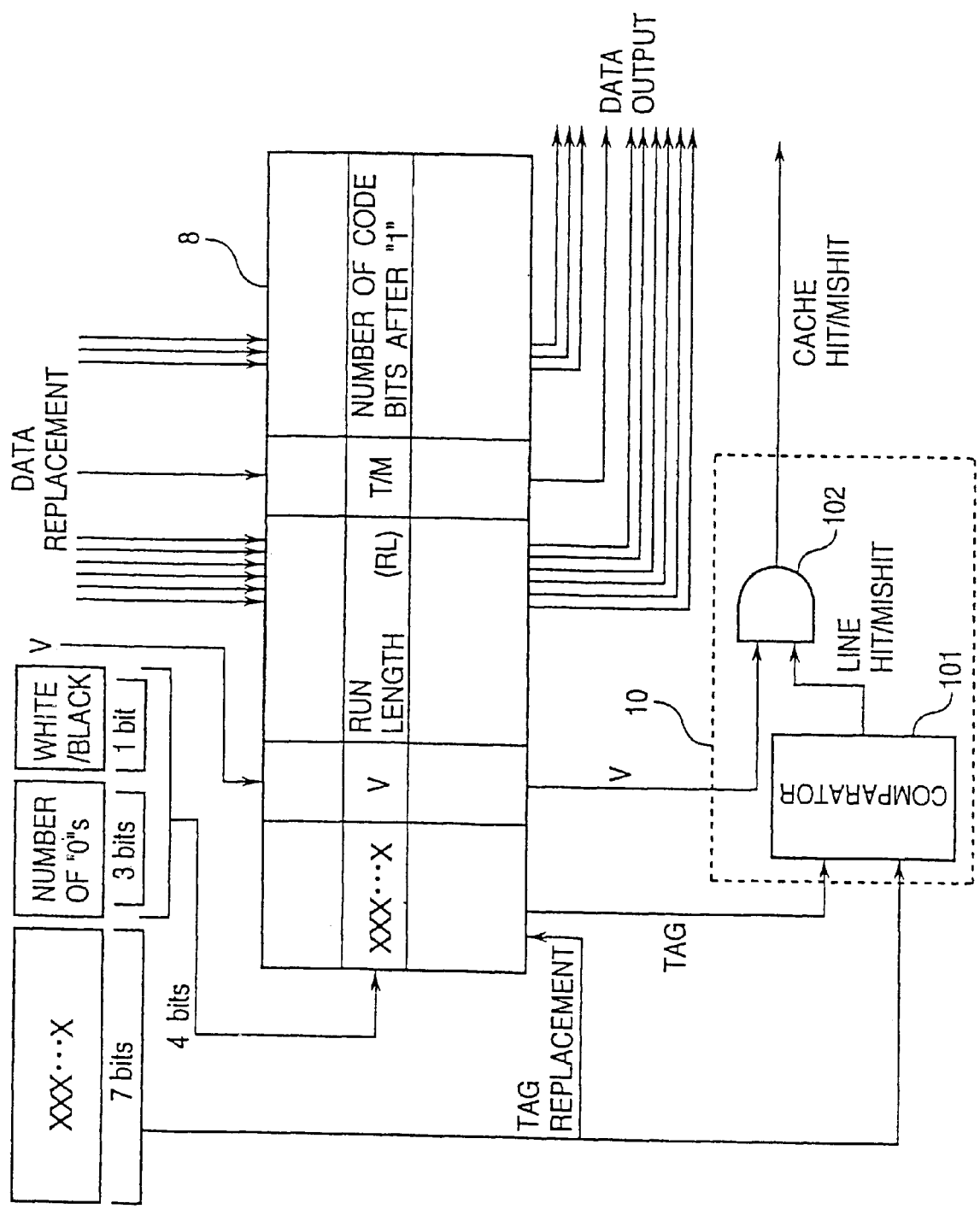
Fig. 5 -PRIOR ART-

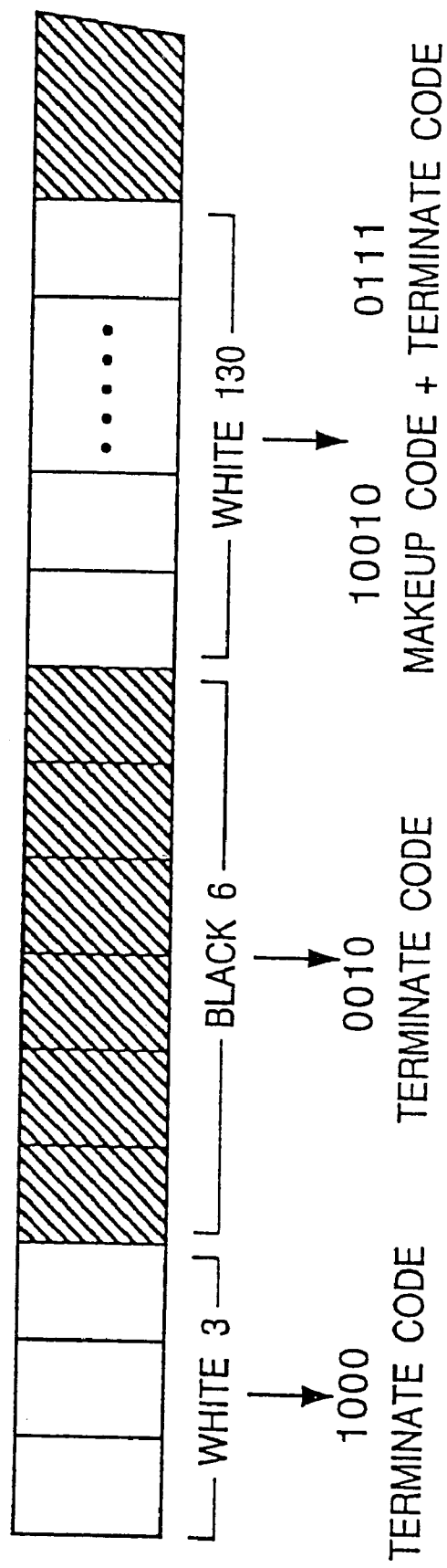
Fig. 6 -PRIOR ART-

Fig. 7 -PRIOR ART-
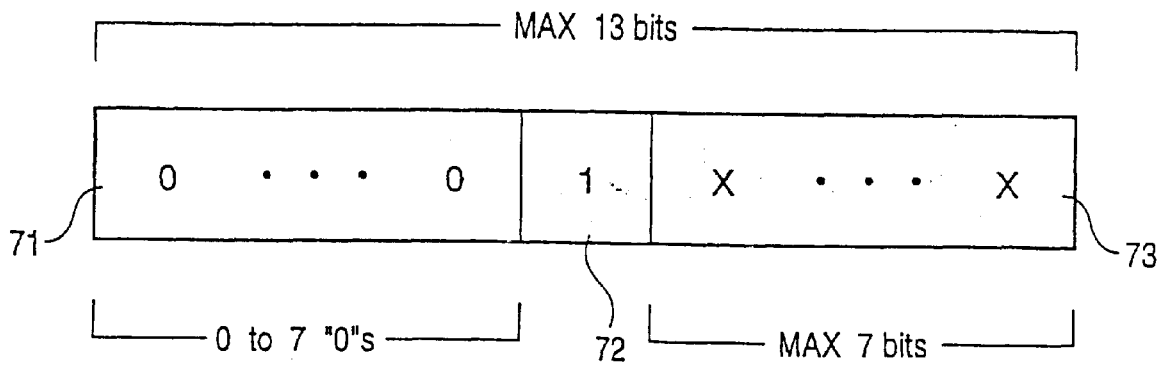
Fig. 8A -PRIOR ART-
INPUT ADDRESS TO DECODING ROM
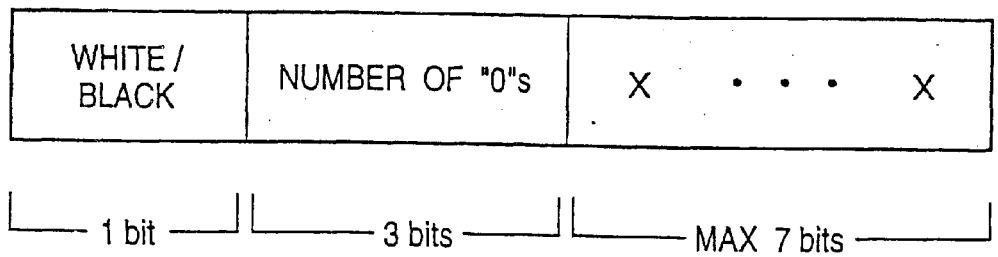
Fig. 8B -PRIOR ART-
OUTPUT DATA OF DECODING ROM
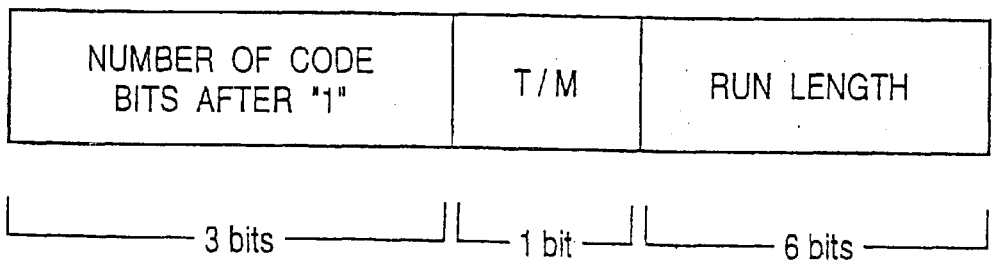

Fig. 9 -PRIOR ART-

TERMINATE CODE TABLE

| RUN LENGTH | WHITE RUN CODE | BLACK RUN CODE | RUN LENGTH | WHITE RUN CODE | BLACK RUN CODE |
|---|---|---|---|---|---|
| 0 | 00110101 | 0000110111 | 32 | 00011011 | 000001101010 |
| 1 | 000111 | 010 | 33 | 00010010 | 000001101011 |
| 2 | 0111 | 11 | 34 | 00010011 | 000011010010 |
| 3 | 1000 | 10 | 35 | 00010100 | 000011010011 |
| 4 | 1011 | 011 | 36 | 00010101 | 000011010100 |
| 5 | 1100 | 0011 | 37 | 00010110 | 000011010101 |
| 6 | 1110 | 0010 | 38 | 00010111 | 000011010110 |
| 7 | 1111 | 00011 | 39 | 00101000 | 000011010111 |
| 8 | 10011 | 000101 | 40 | 00101001 | 000001101100 |
| 9 | 10100 | 000100 | 41 | 00101010 | 000001101101 |
| 10 | 00111 | 0000100 | 42 | 00101011 | 000011011010 |
| 11 | 01000 | 0000101 | 43 | 00101100 | 000011011011 |
| 12 | 001000 | 0000111 | 44 | 00101101 | 000001010100 |
| 13 | 000011 | 00000100 | 45 | 00000100 | 000001010101 |
| 14 | 110100 | 00000111 | 46 | 00000101 | 000001010110 |
| 15 | 110101 | 000011000 | 47 | 00001010 | 000001010111 |
| 16 | 101010 | 0000010111 | 48 | 00001011 | 000001100100 |
| 17 | 101011 | 0000011000 | 49 | 01010010 | 000001100101 |
| 18 | 0100111 | 0000001000 | 50 | 01010011 | 000001010010 |
| 19 | 0001100 | 00001100111 | 51 | 01010100 | 000001010011 |
| 20 | 0001000 | 00001101000 | 52 | 01010101 | 000000100100 |
| 21 | 0010111 | 00001101100 | 53 | 00100100 | 000000110111 |
| 22 | 0000011 | 00000110111 | 54 | 00100101 | 000000111000 |
| 23 | 0000100 | 00000101000 | 55 | 01011000 | 000000100111 |
| 24 | 0101000 | 00000010111 | 56 | 01011001 | 000000101000 |
| 25 | 0101011 | 00000011000 | 57 | 01011010 | 000001011000 |
| 26 | 0010011 | 000011001010 | 58 | 01011011 | 000001011001 |
| 27 | 0100100 | 000011001011 | 59 | 01001010 | 000000101011 |
| 28 | 0011000 | 000011001100 | 60 | 01001011 | 000000101100 |
| 29 | 00000010 | 000011001101 | 61 | 00110010 | 000001011010 |
| 30 | 00000011 | 000001101000 | 62 | 00110011 | 000001100110 |
| 31 | 00011010 | 000001101001 | 63 | 00110100 | 000001100111 |

Fig. 10 -PRIOR ART-

MAKEUP CODE TABLE (A) FOR REGULAR SIZE SHEET

| RUN LENGTH | WHITE RUN CODE | BLACK RUN CODE | RUN LENGTH | WHITE RUN CODE | BLACK RUN CODE |
|---|---|---|---|---|---|
| 64 | 11011 | 0000001111 | 960 | 011010100 | 0000001110011 |
| 128 | 10010 | 000011001000 | 1024 | 011010101 | 0000001110100 |
| 192 | 010111 | 000011001001 | 1088 | 011010110 | 0000001110101 |
| 256 | 0110111 | 000001011011 | 1152 | 011010111 | 0000001110110 |
| 320 | 00110110 | 000000110011 | 1216 | 011011000 | 0000001110111 |
| 384 | 00110111 | 000000110100 | 1280 | 011011001 | 0000001010010 |
| 448 | 01100100 | 000000110101 | 1344 | 011011010 | 0000001010011 |
| 512 | 01100101 | 0000001101100 | 1408 | 011011011 | 0000001010100 |
| 576 | 01101000 | 0000001101101 | 1472 | 010011000 | 0000001010101 |
| 640 | 01100111 | 0000001001010 | 1536 | 010011001 | 0000001011010 |
| 704 | 011001100 | 0000001001011 | 1600 | 010011010 | 0000001011011 |
| 768 | 011001101 | 0000001001100 | 1664 | 011000 | 0000001100100 |
| 832 | 011010010 | 0000001001101 | 1728 | 010011011 | 0000001100101 |
| 896 | 011010011 | 0000001110010 | EOL | 000000000001 | 000000000001 |

(B) FOR WIDTH-EXTENDED SHEET

| RUN LENGTH | CODE COMMON TO WHITE RUN AND BLACK RUN | RUN LENGTH | CODE COMMON TO WHITE RUN AND BLACK RUN |
|---|---|---|---|
| 1792 | 00000001000 | 2240 | 000000010110 |
| 1856 | 00000001100 | 2304 | 000000010111 |
| 1920 | 00000001101 | 2368 | 000000011100 |
| 1984 | 000000010010 | 2432 | 000000011101 |
| 2048 | 000000010011 | 2496 | 000000011110 |
| 2112 | 000000010100 | 2560 | 000000011111 |
| 2176 | 000000010101 | | |

VARIABLE LENGTH DECODING SYSTEM HAVING A MASK CIRCUIT FOR IMPROVED CACHE HIT ACCURACY

BACKGROUND OF THE INVENTION

The present invention relates to a variable length code decoding system having a cache memory.

First, a modified Huffman code (simply called a "MH code" hereinafter) will be described briefly. A MH code system is to convert, in connection with a while/black binary image, the number of continuous pixels of the same color (white or black) (called a "run length") into the MH code.

In the MH code, two series of codes are used which include a terminate code as shown in FIG. 9 and a makeup code as shown in FIG. 10, corresponding to the run length of the while or black. In this code, the run length is represented by a quotient and a remainder obtained when the run length is divided by 64. The makeup code corresponds to the quotient, and the remainder corresponds to the terminate code. Accordingly, assuming that the quotient is represented by M and the remainder is represented by T, the run length RL is expressed as follows:

$$RL = M \times 64 + T$$

Therefore, the terminate code corresponds to the run length of "0" to "63", and the makeup code corresponds to the run length which is a multiple of 64 and which reaches 2560 at maximum.

For example, in the case of a white/black binary image as shown in FIG. 6, first, three white pixels continues, and the run length becomes 3. Referring to the while run code of the run length "3" in the terminate code table of the MH code in FIG. 9, the code of "1000" can be obtained. Accordingly, the run length in the range of "0" pixel to 63 pixels can be coded by on the terminate code.

As regards the run length of not less than 64 pixels, the run length is coded by first using the makeup code table shown in FIG. 10. The makeup code is followed by the terminate code indicating a difference between an actual run length and the run length represented by the makeup code (See the code corresponding to the run length of "WHITE 130" FIG. 6.

Incidentally, the coding of a line head is started with a while run. If an actual line head is a black run, the while run of the run length "0" is coded.

Next, the feature of the MH code will be described. The MH code is constituted by the format that is shown FIG. 7. As shown in FIG. 7, the MH code comprises 13 bits at maximum. In the bit format shown in FIG. 7, a leftmost bit is the most significant bit, and a rightmost bit is the least significant bit. The MH code is composed of a high place bit region 71 consisting of 0 bit to 7 bits, a succeeding fixed region 72 consisting of 1 bit, and a low place bit region 73 consisting of 7 bits at maximum. The values in the high place bit region 71 are "0", and there is possibility that the region 71 itself does not exist. Namely, the MH code has a code sequence in which the number of continuing "0"s before a first "1" appears is seven at maximum and the number of bits succeeding to the first "1" is also seven at maximum.

For example, when the three white pixels continue as shown in FIG. 6, it is coded to a four-bit MH code which does not include the region 71 and which the region 72 of "1" and the region 73 of "000". When 130 white pixels continue as shown in FIG. 6, it is coded to an MH code having no region 71 and the region 72 of "1" and the region 73 of "0010", which is followed by an MH code having the region 71 of only one "0", the region 72 of "1" and the region 73 of "11" outputted in the named order. The MH code is transferred serially from the most significant bit in order.

Now, a conventional MH code decoding system will be described. The decoding of the MH code is to convert the serially transferred and inputted MH code into the run length. This conversion is conventionally carried out by referring to a decoding conversion table stored in a ROM (read only memory).

Since the MH code is 13 bits at maximum, the conventional MH code decoding system is configured to carry out the decode by supplying a 14-bit address obtained by adding one bit of a white/black information to the MH code, to an address of the decoding conversion ROM, and by obtaining information of 11 bits in total, including 6 bits of the run length, four bits of the code length, and one bit indicative of which of the terminate code and the makeup code it is.

For example, the MH code decoding system disclosed by Japanese Patent Application Post-examination Publication No. JP-B-02-002350, is configured to decode as follows in order to reduce the capacity of the ROM. This decoding system utilizes the feature in which, in the serially transferred and inputted MH code sequence, the number of continuing "0"s before the first "1" appears is seven at maximum and the number of bits succeeding to the first "1" is also seven at maximum. An address of 11 bits comprising 3 bits indicative of the number of continuing "0"s before the first "1" appears, 7 bits succeeding to the first "1", and one bit indicative of a while/black information, is supplied as an address of the decoding conversion ROM. Information of 10 bits in total comprising 6 bits of the run length, 3 bits indicative of the number of the remaining bits in the actual code, succeeding to "1" detected after the continuing "0"s, and one bit indicative of the terminate code/makeup code information. Thus, the decoding is carried out.

However, when the code data is inputted at a constant rate such as 33.6 Kbps, if the code length is relatively long, a processing time can have a margin, but if the code length is relative short, unless the processing is carried out at a high speed, the processing cannot be completed before a next code is inputted. For this purpose, a decoded data processed once is stored in a cache memory which can be read out at a speed higher than the ROM, so that when the same code pattern is inputted, the decoded data can be read out from the cache memory, without reading from a low speed ROM.

Furthermore, Japanese Patent Application Pre-examination Publication No. JP-A-09-185548 proposes a method in which decoded data corresponding to a relatively short length requiring a high speed reference, is previously transferred to a cache memory, and the cache memory is locked, so as to avoid a cache missing.

Referring to FIG. 4, there is shown a block diagram illustrating one example of the conventional MH code decoding system. In FIG. 4, a code input shift register 1 is a 8-bit shift register for bit-serially receiving a MH code sequence, and is controlled to shift leftward by a shifter 7. A zero counting circuit 3 counts the number of continuing "0"s (which is seven at maximum) before the first "1" appears in an input sequence of the shift register 1. A white/black register 2 is a one-bit register for designating the color of a white or black in the image. Here, the content of the white/black register 2 is inverted when the value of a T/M bit of an output of a control circuit 11 explained hereinafter indicates "T".

A zero count register 4 holds three bits of a count output of the zero counting circuit 3. A ROM (read only memory)

5 previously stores a decoding conversion table. The ROM 5 receives, as an address input, 11 bits in total consisting of the three bits of the zero count register 4, code bits of 7 bits succeeding to the "1" firstly appearing in the shift register 1, and one bit of the white/black register 2 designating the color of the white or black in the image. The ROM 5 outputs 10 bits in total consisting of 6 bits indicative of the run length (RL) to be actually decoded, one bit indicative of the terminate code/makeup code (T/M) information, and three bits indicative of the number of the remaining bits in the actual code, succeeding to the "1" firstly appearing in the shift register 1.

A cache memory 8 can be read and written at a high speed, and receives, as an input address, the three bits of the zero count register 4 and the one bit of the white/black register 2. A comparing circuit 10 receives and compares the most significant 7 bits of the output of the shift register 1 and 7 bits of a tag value outputted from the cache memory 8. When coincidence is obtained and when a valid bit value V (valid or invalid) of one bit outputted from the cache memory 8 indicates the valid, the comparing circuit 10 outputs a control signal indicative of a cache hit. Otherwise, the comparing circuit 10 outputs a control signal indicative of a mishit.

When the control signal outputted from the comparing circuit 10 is indicative of the cache hit, the control circuit 11 selects and outputs data of 10 bits in total comprising 6 bits indicative of the run length (RL) and outputted from the cache memory 8, one bit indicative of the terminate code/ makeup code (T/M) information and three bits indicative of the number of the remaining bits in the actual code, succeeding to the "1" firstly appearing in the shift register 1. When the control signal outputted from the comparing circuit 10 is indicative of the mishit, the control circuit 11 selects and outputs the 10-bit data from the ROM 5, and thereafter, writes the same data into the cache memory 8, registers the most significant 7 bits of the output of the shift register 1 into a tag section of the cache memory, and sets a corresponding valid bit V of the cache memory.

A selector 6 selects either the three-bit output of the zero count register 4 or the three-bit output of the control circuit 11 to output the selected one to the shifter 7. The shifter 7 adds "+1" to the number indicated by the three-bit input, and leftward shifts the shift register by the obtained number.

An image generating circuit 12 receives 8 bit in total including the 6 bits of the run length from the control circuit 11, the one bit from the white/black register 2 and the one bit indicative of the terminate code/makeup code (T/M) information, and generates an image of the actual run length on the basis of the received bits. An output of the image generating circuit 12 is outputted through a FIFO memory 13 as an image information.

Referring to FIG. 5, it illustrates an example of the construction of the cache memory 8 and the comparing circuit 10 in the decoding system shown in FIG. 4. The cache memory 8 comprises 16 lines, each of which is constituted of a tag, a valid bit (V), and data (run length, T/M bit, and the number of the remaining bits in the actual code, succeeding to the "1" firstly appearing in the MH code sequence). 4 bits in total composed of the three bits of the zero count register 4 and the one bit of the white/black register 2, constitute an index for selecting the line. Code bits of the 7 bits succeeding to the "1" firstly appearing in the shift register 1 become a tag, which is associated with a valid bit (V) of one bit indicating whether the data in each line is valid or invalid.

The comparing circuit 10 comprises a comparator 101 and a logical AND gate 102. The comparator 101 compares the 7 bits succeeding to the "1" firstly appearing in the shift register 1 with the 7 bits of the tag value outputted from the cache memory 8, and outputs a control signal indicative of a line hit when coincidence is obtained. The AND gate 102 executes a logical AND between the value of the control signal outputted from the comparator 101 and the value of the valid bit (V) (one bit) outputted from the cache memory 8. Thus, the AND gate 102 outputs a control signal indicative of a cache hit only when the control signal outputted from the comparator 101 is indicative of the line hit, and when the valid bit value (V) is indicative of the valid. Otherwise, the AND gate 102 outputs a control signal indicative of a mishit Next, an operation of the above mentioned decoding system will be described. In FIG. 4, first 8 bits of a serially transferred MH code sequence are inputted and held in a shift register I. The number of "0"s from the leftmost bit position of the shift register 1 before the "1" firstly appearing in the shift register, is counted by use of the zero counting circuit 3, and the obtained value is stored in the zero count register 4. The value stored in the zero count register 4 is selected by the selector 6 and supplied to the shifter 7.

This shifter 7 leftward shifts the content of the shift register 1 by the value obtained by adding "+1" to the received value, and succeeding bits are inputted and held in the shift register by the number of bits which was leftward shifted. With this operation, code bits of 7 bits at maximum, succeeding to the "1" firstly appearing in the shift register, are held in the shift register 1. Thus, as shown in FIG. 8A, the code bits of 7 bits succeeding to the "1" firstly appearing in the shift register, the one bit outputted from the white/ black register 2, and the value (3 bits) of the zero count register 4, are supplied as an address to the ROM 5. And, as shown in FIG. 8B, the ROM 5 outputs 10 bits in total including the 6 bits indicative of the run length, the one bit (T/M) indicative of the terminate code/makeup code information, and the three bits indicative of the number of the remaining bits in the actual code, succeeding to the "1" firstly appearing in the shift register 1.

On the other hand, four bits in total composed of the 3 bits of the output of the zero count register 4 and the one bit of the white/black register 2, are supplied as an address to the cache memory 8.

As shown in FIG. 5, in the cache memory 8, the line is selected by using, as an index, the four bits in total composed of the 3 bits of the zero count register 4 and the one bit of the white/black-register 2. The cache memory 8 outputs the 7 bits of the tag of the selected line, one bit of the valid bit value of the selected line and 10 bits of the data (run length, T/M bit, and the number of the remaining bits in the actual code, succeeding to the "1" firstly appearing in the MH code sequence). The tag of the selected line is supplied to the comparator 101, which compares with the 7 bits of the tag outputted from the cache memory with the 7 bits succeeding to the "1" firstly appearing in the shift register 1, and outputs the control signal indicative of the line hit when coincidence is obtained. The AND gate 102 receives the control signal of the comparator 101 and the valid value (V) of the selected line in the cache memory 8, and outputs the result of the execution of the logical AND. Thus, only when the control signal outputted from the comparator 101 is indicative of the line hit and the valid bit value (V) is indicative of the valid, the AND gate 102 outputs the control signal indicative of a cache hit. Otherwise, the AND gate 102 outputs the control signal indicative of a mishit Returning to FIG. 4, when the control signal outputted from the comparing circuit 10 is indicative of the cache hit, the control circuit 11 selects and outputs the 10 bits in total outputted from the cache memory 8, including the 6 bits indicative of the run length (RL), the one bit (T/M) indicative of the terminate code/makeup code information, and the three bits indicative of the number of the remaining bits in the actual code, succeeding to the "1" firstly appearing in the shift register 1. When the control signal outputted from the comparing circuit 10 is indicative of the mishit, the control circuit 11 selects and outputs the 10-bit data outputted from the ROM 5.

Succeedingly, the control circuit 11 writes the 10-bit data outputted from the ROM 5, into the line in the cache memory designated by the four bits in total composed of the 3 bits of the zero count register 4 and the one bit of the white/black register 2. Furthermore, the control circuit 11 registers the most significant 7 bits of the output of the shift register 1, to the tag of the selected line, and sets the valid bit (V) of the selected line. These values registered and set in the cache memory are used at a next and succeeding accesses to the cache memory 8.

Of the 10-bit data outputted from the control circuit 11 (RL, T/M, and the number of the remaining bits in the actual code, succeeding to the firstly appeared "1"), the run length of 6 bits and the T/M bit of one bit are supplied in parallel together with one bit of the white/black register 2, to the image generating circuit 12. This data is restored into a image signal by the image generating circuit 12, and the restored image signal is serially supplied to the FIFO memory 13. Here, when the value of the T/M bit indicates M (makeup code), the value of the run length is multiplied by 64. On the other hand, when the value of the T/M bit indicates T (terminate code), the value of the run length is outputted as it is and the content of the while/black register is inverted.

Furthermore, the bits indicative of the number of the remaining bits in the actual code, succeeding to the firstly appeared "1", are outputted from the control circuit, and are selected by the selector 6 to be supplied to the shifter 7. The number of the remaining bits in the actual code, succeeding to the firstly appeared "1", becomes information which determine a heading position of a code to be next decoded. Namely, the shifter 7 leftward shifts the content of the shift register 1 by the number of the remaining bits in the actual code, succeeding to the firstly appeared "1", and new code bits are inputted into the shift register 1 by the shifted number. Thus, the code to be next decoded is set in the shift register. The above mentioned operation is repeated for the decoding until the code becomes not inputted.

In the above mentioned conventional MH code decoding system, since the cache memory is accessed by using a portion of the variable length code as an address input, there is a waste in a data storage of the cache memory, and therefore, the hit rate of the cache memory 8 is low.

For example, in the decoding system shown in FIG. 4, when the "black 16" (code="0000010111") is decoded, the value of the zero count register 4 is "101" (=5), the value of the white/black register 2 is "1" indicative of black, and the code of the 7 bits succeeding to the firstly appeared "1", is "0111XXX (where "XXX" is a portion of a next code succeeding to the code of the "black 16" in the code sequence).

Therefore, the address (index) supplied to the cache memory 8 is "1011", since it is composed of four bits in total including the three bits of the zero count register 4 and the one bit of the while/black register 2. Since the tag is the code of the 7 bits succeeding to the firstly appeared "1", it become "0111XXX". In this case, since this is a heading one of the code sequence, the cache memory 8 is mishit, and the data (run length, T/M bit, and the number of the remaining bits in the actual code, succeeding to the firstly appeared "1") is read out from the ROM 5. This data is stored in a data storing region of the "1011"th line in the cache memory 8. Simultaneously, "0111XXX" is stored in the tag of the "1011"th line, and the valid bit (V) of the "1011"th line is set.

In succeeding accesses, when the code of the "black 16" is inputted, "1011" is supplied to the cache memory 8 as an address (index), and the stored "0111XXX" is outputted as the tag value. However, since the code succeeding to the second "black 16" is not necessarily the same as the code succeeding to the first "black 16", the code of the 7 bits succeeding to the firstly appeared "1" stored in the shift register 1 is "0111YYY" (where "YYY" is a portion of a next code succeeding to the code of the second "black 16" in the code sequence). Therefore, "XXX" is not necessarily equal to "YYY".

Accordingly, the data inputted from the shift register 1 to the comparing circuit 10 is "0111YYY", which is not necessarily equal to "0111XXX" of the tag value supplied from the cache memory 8. As a result, although the decoded data of the "black 16" exists in the cache memory 8, the cache is mishit and therefore the cache is not necessarily hit.

As mentioned above, in the conventional decoding system for the variable length code such as the MH code, whether the cache is hit or mishit is judged by discriminating whether or not the portion of the variable length code as an address input to the cache memory, is coincident with the tag stored in the cache memory. In this case, however, when the variable length code is inputted, it is not clear where the code terminates. Therefore, when the code has a length shorter than a maximum code length, data that is not included in the actual code to be decoded (namely, a portion of the code succeeding to the actual code to be decoded) becomes a portion of the input address. On the other hand, the tag value stored in the cache memory includes data that was not included in the actual code decoded (namely, a portion of the code that succeeded to the actual code decoded). Therefore, since two data portions not included in the actual code do not necessarily become the same, a portion of the input address of the cache memory and the tag stored in the cache memory are not often coincident with each other, with the result that the cache is mishit.

Therefore, a problem is encountered in which although the decoded data exists in the cache memory, the cache is mishit, and therefore, the hit rate of the cache memory is low.

As proposed in Japanese Patent Application Preexamination Publication No. JP-A-09-185548, in the case that some number of items of decoded data corresponding to a relatively short code length are previously transferred to a cache memory, and the cache memory is locked so as to avoid a cache missing, it is possible to reduce the mishit of the cache memory attributable to the fact that no data to be referred exists in the cache memory. However, there still exists the above mentioned problem in which although the decoded data exists in the cache memory, the cache is mishit.

BRIEF SUMMARY OF THE INVENTION

Accordingly, it is an object of the present invention to provide a variable length code decoding system having a cache memory, which has overcome the above mentioned problem of the prior art.

Another object of the present invention is to provide a variable length code decoding system having a cache memory, capable of effectively storing data in the cache memory to elevate the hit rate of the cache memory.

The above and other objects of the present invention are achieved in accordance with the present invention by a variable length code decoding system having a cache memory and so configured to execute a decoding by accessing the cache memory by using a variable length code as an address, the system comprising a hit/mishit discriminating means for discriminating whether or not the cache is hit, by comparing the address with a tag read out from the cache memory in only a limited range corresponding to an effective code length of the variable length code.

In an embodiment of the variable length code decoding system, the hit/mishit discriminating means includes a mask circuit and a comparing circuit. The mask circuit receives code bits of 7 bits succeeding to a firstly appeared "1" in a modified Huffman code sequence, a tag value of 7 bits outputted from the cache memory, and the number of remaining bits in an actual code, succeeding to the firstly appeared "1", which is a portion of data outputted from the cache memory. The mask circuit outputs the code bits of 7 bits succeeding to the firstly appeared "1" and having bits which are other than the remaining bits in the actual code and which are masked by the mask circuit, and the tag value of the 7 bits outputted from the cache memory and having bits which are other than the remaining bits in the actual code and which are masked by the mask circuit.

The comparing circuit receives and compares the code bits of 7 bits having the bits masked by the mask circuit and the tag value of the 7 bits having the bits masked by the mask circuit, so that the comparing circuit outputs a control signal indicative of a cache hit only when coincidence is obtained in the comparison and a valid bit outputted from the cache memory is indicative of valid. The comparing circuit otherwise outputs a control signal indicative of a mishit.

Specifically, the mask circuit includes a mask value generating circuit and first and second logical AND circuits. The mask value generating circuit receives the number of remaining bits in the actual code, succeeding to the firstly appeared "1", and outputs a mask value of 7 bits for masking the bits which are other than the remaining bits in the actual code. The first logical AND circuit receives the mask value of 7 bits and the tag value of the 7 bits outputted from the cache memory, for outputting the tag value of the 7 bits having the bits which are other than the remaining bits in the actual code and which are masked by the mask circuit. The second logical AND circuit receives the mask value of 7 bits and the code bits of 7 bits succeeding to the firstly appeared "1" in the modified Huffman code sequence, for outputting the code bits of 7 bits having the bits which are other than the remaining bits in the actual code and which are masked by the mask circuit.

In addition, the comparing circuit includes a comparator and a logical AND gate. The comparator compares the code bits of 7 bits having the bits masked by the mask circuit and the tag value of the 7 bits having the bits masked by the mask circuit, for outputting a control signal indicative of a line hit when coincidence is obtained. The logical AND gate receives the control signal from the comparator and the valid bit outputted from the cache memory, for outputting the control signal indicative of the cache hit only when the control signal from the comparator is indicative of the line hit and the valid bit is indicative of the valid. The logical AND gate otherwise outputs the control signal indicative of the mishit.

In another embodiment of the variable length code decoding system, the cache memory includes a plurality of cache memories, and the hit/mishit discriminating means includes a mask circuit and a comparing circuit provided for each of the plurality of cache memories.

Each mask circuit receives code bits of 7 bits succeeding to a firstly appeared "1" in a modified Huffman code sequence, a tag value of 7 bits outputted from a corresponding cache memory, and the number of remaining bits in an actual code, succeeding to the firstly appeared "1", which is a portion of data outputted from the corresponding cache memory. Each mask circuit outputs the code bits of 7 bits having bits which are other than the remaining bits in the actual code and which are masked by the mask circuit, and the tag value of the 7 bits having bits which are other than the remaining bits in the actual code and which are masked by the mask circuit.

Each comparing circuit receives and compares the code bits of 7 bits having the bits masked by the corresponding mask circuit and the tag value of the 7 bits having the bits masked by the corresponding circuit, each comparing circuit outputting a control signal indicative of a cache hit only when coincidence is obtained in the comparison and a valid bit outputted from the corresponding cache memory is indicative of valid. The comparing circuit otherwise outputs a control signal indicative of a mishit.

The system further includes:

a control circuit;

a shift register receiving the modified Huffman code sequence;

a zero detecting means for detecting the number of continuing "0"s, which is seven at maximum, before the firstly appeared "1" appears in the modified Huffman code sequence, the zero detecting means outputting three bits indicative of the number of continuing "0"s thus detected;

a decoding conversion ROM receiving, as an address input, 11 bits in total comprising the three bits indicative of the number of continuing "0"s, the code bits of 7 bits succeeding to the firstly appeared "1", and one bit indicative of a color of white or black of an image to be decoded, the decoding conversion ROM outputting 10 bits in total comprising 6 bits indicative of the run length to be actually decoded, one bit indicative of which of a terminate code and a makeup code the code under decoding is, and the three bits indicative of the number of remaining bits in the actual code, succeeding to the firstly appeared "1";

a discriminating circuit receiving the control signal from each comparing circuit, the discriminating circuit outputting to the control circuit, a second control signal indicative of a cache hit when any of the comparing circuits outputs the first mentioned control signal indicative of the cache hit and a discriminating signal indicative of which of the plurality of cache memories is hit, the discriminating circuit outputting the second control signal indicative of a mishit to the control circuit when none of the comparing circuits outputs the first mentioned control signal indicative of the cache hit;

a first selector receiving the discriminating signal for selecting, among 10-bit data respectively outputted from the plurality of cache memories, the 10-bit data outputted from a hit cache memory in accordance with the discriminating signal, the first selector outputting the selected 10-bit data;

a selecting circuit receiving a valid bit outputted from each of the plurality of cache memories, the selecting circuit outputting a selection control signal for selecting a cache memory outputting the valid bit indicative of invalid when any of the received valid bits is indicative of invalid, the selecting circuit outputting the selection control signal for forcibly selecting any of the plurality of cache memories when all of the received valid bits are indicative of valid; and a second selector receiving the selection control signal for selecting one of the plurality of cache memories in accordance with the selection control signal, so that when the second control signal outputted from the discriminating circuit indicates the mishit, the control circuit selects the 10-bit data from the decoding conversion ROM, and outputs the selected 10-bit data to the second selector, and the selected 10-bit data is written through the second selector into the cache memory selected by the second selector at a line of the selected cache memory designated by four bits in total including the three bits outputted from the zero detecting means and the one bit indicative of the color of white or black, most significant 7 bits of an output of the shift register being registered into a tag of the line written with the selected 10-bit data, and the valid bit in the line written with the selected 10-bit data being set, whereby these values are used in a next and succeeding accesses to the cache memories.

With the above mentioned arrangement, when the decoding is carried out by accessing the cache memory by using a variable length code as an address, whether the cache memory is hit or mishit is judged by discriminating whether or not the code bits of the 7 bits succeeding to the firstly appeared "1" in the actual code are coincident with the tag stored in the cache memory. Here, this comparison is carried out by masking bits other than an effective bit length of the actual code, by utilizing the three-bit information indicating the number of remaining bit in the actual code, succeeding to the firstly appeared "1", outputted from the cache memory. Thus, the hit rate of the cache memory can be elevated.

The above and other objects, features and advantages of the present invention will be apparent from the following description of preferred embodiments of the invention with reference to the accompanying drawings.

BRIEF DESCRIPTION OF THE DRAWINGS

FIG. 4 is a block diagram illustrating one example of the conventional MH code decoding system;

FIG. 5 is a detailed block diagram of a portion of the decoding system shown in FIG. 4;

FIG. 6 illustrates an example of a white/black binary image;

FIG. 7 illustrates a format of the MH code;

FIG. 8A illustrates an example of an input to the ROM shown in the system shown in FIGS. 1 and 4;

FIG. 8B illustrates an example of an output from the ROM shown in the system shown in FIGS. 1 and 4;

FIG. 9 is a table illustrating a terminate code and

FIG. 10 is a table illustrating a makeup code.

DETAILED DESCRIPTION OF THE INVENTION

Now, embodiment of the variable length code decoding system in accordance with the present invention will be described with reference to the accompanying drawings.

Figure 1:
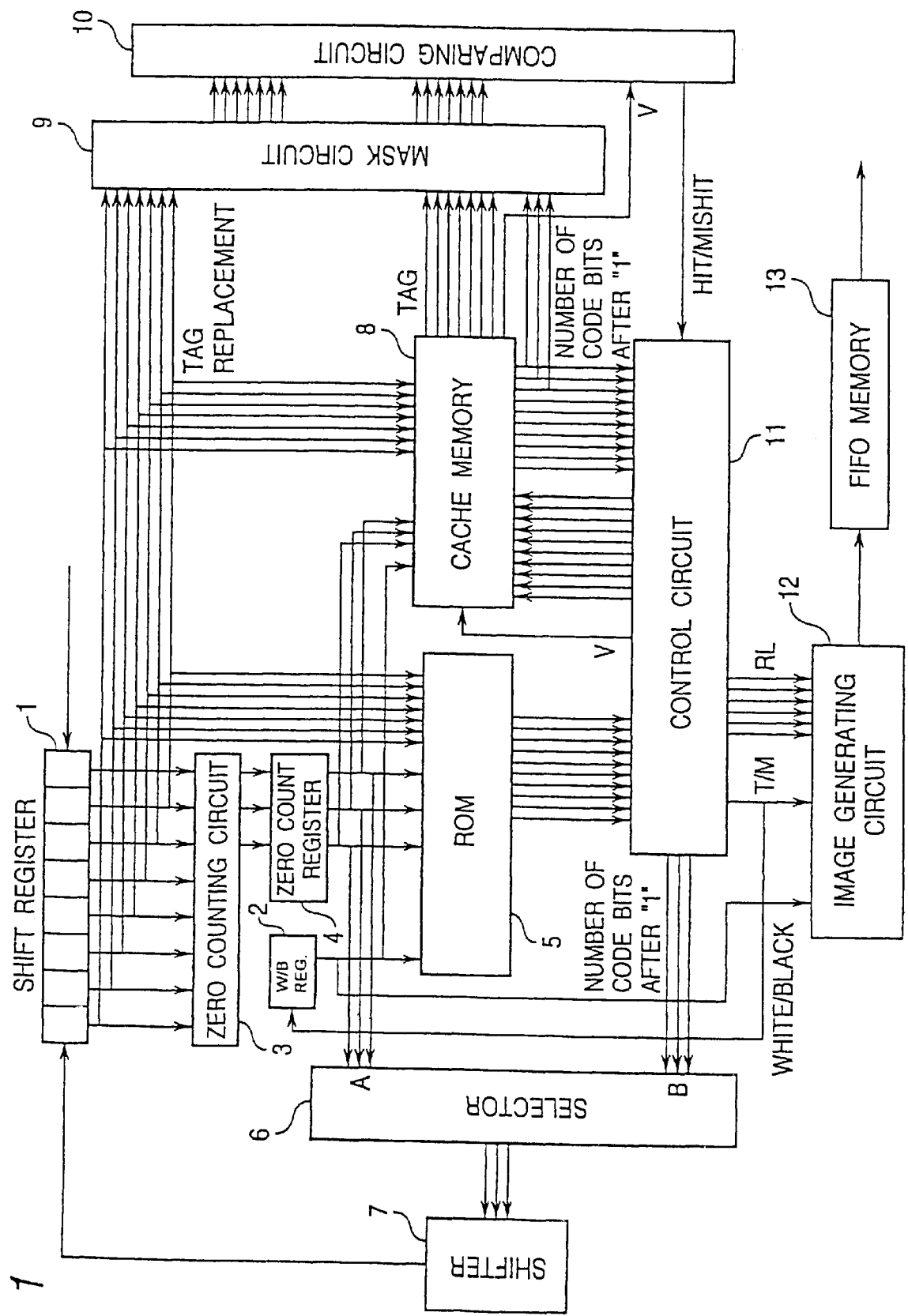
FIG. 1 is a block diagram of an embodiment of the variable length code decoding system in accordance with the present invention.

Referring to FIG. 1, there is shown a block diagram of an embodiment of the MH code decoding system in accordance with the present invention. This embodiment is characterized by comprising a mask circuit 9. In FIG. 1, elements corresponding to those shown in FIG. 4 are given the same reference numbers.

A code input shift register 1 is a 8-bit shift register for bit-serially receiving a MH code sequence, and is controlled to shift leftward by a shifter 7. A zero counting circuit 3 counts the number of continuing "0"s (which is seven at maximum) before the first "1" appears in an input sequence applied to the shift register 1. A white/black register 2 is a one-bit register for designating the color of a white or black in the image. Here, the content of the white/black register 2 is inverted when the value of a T/M bit of an output of a control circuit 11 explained hereinafter indicates "T". A zero count register 4 holds three bits of a count output of the zero counting circuit 3.

A ROM (read only memory) 5 previously stores a decoding conversion table. The ROM 5 receives, as an address input, 11 bits in total consisting of the three bits of the zero count register 4, code bits of 7 bits succeeding to the "1" firstly appearing in the shift register 1, and one bit of the white/black register 2 designating the color of the white or black in the image. The ROM 5 outputs 10 bits in total consisting of 6 bits indicative of the run length (RL) to be actually decoded, one bit (T/M) indicative of the terminate code/makeup code information, and three bits indicative of the number of the remaining bits in the actual code, succeeding to the "1" firstly appearing in the shift register 1.

A cache memory 8 can be read and written at a high speed, and receives, as an input address, the three bits of the zero count register 4 and the one bit of the white/black register 2. A mask circuit 9 receives the most significant 7 bits of the output of the shift register 1 (7 bits succeeding to the "1" firstly appearing in the shift register 1), 7 bits of a tag value outputted from the cache memory 8, and a portion of the data outputted from the cache memory 8, indicating the number of remaining bits succeeding to the firstly appeared "1" in an actual code. The mask circuit 9 outputs the most significant 7 bits of the output of the shift register 1 in which the bits other than the remaining bits succeeding to the firstly appeared "1" in the actual code are masked, and the 7 bits of a tag value outputted from the cache memory 8, in which the bits other than the remaining bits succeeding to the firstly appeared "1" in the actual code are masked.

A comparing circuit 10 receives and compares the masked most significant 7 bits of the output of the shift register 1 and the masked 7 bits of the tag value outputted from the cache memory 8. When coincidence is obtained and when a valid bit value V of one bit outputted from the cache memory 8 indicates the valid, the comparing circuit 10 outputs a control signal indicative of a cache hit. Otherwise, the comparing circuit 10 outputs a control signal indicative of a mishit.

When the control signal outputted from the comparing circuit 10 is indicative of the cache hit, the control circuit 11 selects and outputs data of 10 bits in total comprising 6 bits indicative of the run length (RL) and outputted from the cache memory 8, one bit indicative of the terminate code/makeup code (T/M) information and three bits indicative of the number of the remaining bits in the actual code, succeeding to the "1" firstly appearing in the shift register 1. When the control signal outputted from the comparing circuit 10 is indicative of the mishit, the control circuit 11 selects and outputs the 10-bit data from the ROM 5, and thereafter, writes the same data into the cache memory 8, registers the most significant 7 bits of the output of the shift register 1 into a tag section of the cache memory, and sets a corresponding valid bit V of the cache memory.

A selector 6 selects either the three-bit output of the zero count register 4 or the three-bit output of the control circuit 11 to output the selected one to the shifter 7. The shifter 7 leftward shifts the shift register by the number obtained by adding "+1" to the number indicated by the three-bit input.

An image generating circuit 12 receives 8 bit in total including the 6 bits of the run length from the control circuit 11, the one bit from the white/black register 2 and the one bit indicative of the terminate code/makeup code (T/M) information, and generates an image of the actual run length on the basis of the received bits. The run length image generated in the image generating circuit 12 is outputted through a FIFO memory 13 as an image information.

Figure 2:
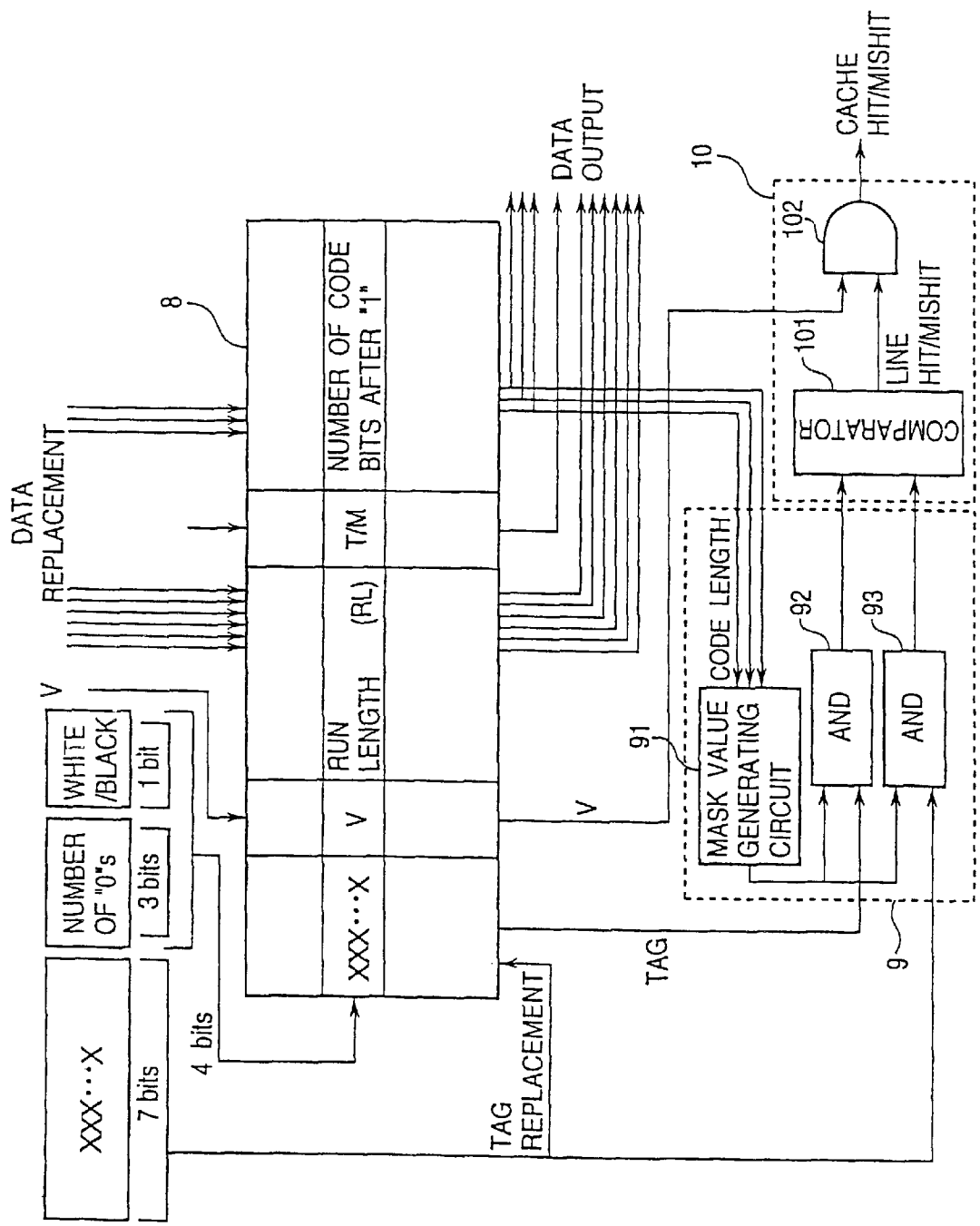
FIG. 2 is a detailed block diagram of a portion of the decoding system shown in FIG. 1.

Referring to FIG. 2, it illustrates an example of the construction of the cache memory 8, the mask circuit 9 and the comparing circuit 10 in the decoding system shown in FIG. 1. The cache memory 8 comprises 16 lines, each of which is constituted of a tag, a valid bit (V), and data (run length, T/M bit, and the number of the remaining bits in the actual code, succeeding to the firstly appeared "1") 4 bits in total composed of the three bits of the zero count register 4 and the one bit of the white/black register 2, constitute an index for selecting the line. The 7 bits succeeding to the "1" firstly appearing in the shift register 1 become a tag, which is associated with a valid bit (V) of one bit indicating whether the data in each line is valid or invalid.

The mask circuit 9 includes a mask value generating circuit 91 and logical AND gates 92 and 93. The mask value generating circuit 91 receives from the cache memory 8, the number of remaining bits succeeding to the firstly appeared "1" in an actual code. The mask value generating circuit 91 generates a mask value (7 bits) for masking, at the succeeding AND gates 92 and 93, the bits other than the remaining bits succeeding to the firstly appeared "1" in the actual code.

For example, when the number of remaining bits, in an actual code, succeeding to the firstly appeared "1" in the MH code sequence is 3 ("011"), the mask value becomes "1110000". This mask value of 7 bits and the tag value of the 7 bits outputted from the cache memory 8 are supplied to the AND gate 92. With execution of this logical AND, the bits other than the remaining bits succeeding to the firstly appeared "1" are masked. On the other hand, the mask value of 7 bits and the code bits of the 7 bits succeeding to the firstly appeared "1" in the shift register 1, are supplied to the AND gate 93. With execution of this logical AND, the bits other than the remaining bits in the actual code, succeeding to the firstly appeared "1", are masked.

The comparing circuit 10 comprises a comparator 101 and a logical AND gate 102. The comparator 101 compares the 7 bits which succeed to the "1" firstly appearing in the shift register 1 and which are masked by the mask circuit 9, with the 7 bits of the tag value which are outputted from the cache memory 8 and which are masked by the mask circuit 9. When coincidence is obtained, the comparator 101 outputs a control signal indicative of a line hit. The AND gate 102 executes a logical AND between the value of the control signal outputted from the comparator 101 and the value of the valid bit (V) (one bit) outputted from the cache memory 8. Thus, the AND gate 102 outputs a control signal indicative of a cache hit only when the control signal outputted from the comparator 101 is indicative of the line hit and the valid bit value (V) is indicative of the valid. Otherwise, the AND gate 102 outputs a control signal indicative of a mishit Next, an operation of the above mentioned decoding system will be described. In FIG. 1, first 8 bits of a serially transferred MH code sequence are inputted and held in a shift register 1. The number of "0"s from the leftmost bit position of the shift register 1 before the "1" firstly appearing in the shift register, is counted by use of the zero counting circuit 3, and the obtained value is stored in the zero count register 4. The value stored in the zero count register 4 is selected by the selector 6 and supplied to the shifter 7.

This shifter 7 leftward shifts the content of the shift register 1 by the value obtained by adding "+1" to the received value, so that succeeding code bits are inputted and held in the shift register by the number of bits which was leftward shifted. With this operation, code bits of 7 bits at maximum, succeeding to the firstly appeared "1", are held in the shift register 1. Thus, as shown in FIG. 8A, 11 bits in total comprising the code bits of 7 bits succeeding to the firstly appeared "1", the one bit outputted from the white/black register 2, and the value (3 bits) of the zero count register 4, are supplied as an address to the ROM 5. And, as shown in FIG. 8B, the ROM 5 outputs 10 bits in total including the 6 bits indicative of the run length (R/L), the one bit (T/M) indicative of the terminate code/makeup code information, and the three bits indicative of the number of the remaining bits in the actual code, succeeding to the firstly appeared "1".

On the other hand, four bits in total composed of the 3 bits of the output of the zero count register 4 and the one bit of the white/black register 2, are supplied as an address to the cache memory 8.

As shown in FIG. 2, in the cache memory 8, the line is selected by using, as an index, the four bits in total composed of the 3 bits of the zero count register 4 and the one bit of the white/black register 2. The cache memory 8 outputs the 7 bits of the tag of the selected line, one bit of the valid bit value (V) of the selected line and 10 bits of the data (run length, T/M bit, and the number of the remaining bits in the actual code, succeeding to the firstly appeared "1").

Of the 10-bit data outputted from the cache memory 8, three bits indicative of the number of the remaining bits in the actual code, succeeding to the firstly appeared "1", are supplied to the mask value generating circuit 91 in the mask circuit 9. The mask circuit 9 generates the mask value (7 bits) for masking, at the succeeding AND gates 92 and 93, the bits other than the remaining bits in the actual code, succeeding to the firstly appeared "1".

For example, in the case of the "black 16" (code= "0000010111"), since the bits in the actual code, succeeding to the firstly appeared "1" in the MH code sequence, are "0111", the number of the remaining bits in the actual code, succeeding to the firstly appeared "1" is four. Therefore. "100" (=4) is inputted to the mask value generating circuit 91, which then outputs "1111000" as the mask value. The mask value of 7 bits outputted from the mask value generating circuit 91 and the tag value of the 7 bits outputted from the cache memory 8 are supplied to the AND gate 92. With execution of this logical AND, the bits other than the remaining bits succeeding to the firstly appeared "1" are masked. On the other hand, the mask value of 7 bits outputted from the mask value generating circuit 91 and the code bits of the 7 bits succeeding to the firstly appeared "1" in the shift register 1, are supplied to the AND gate 93. With execution of this logical AND, the bits other than the remaining bits in the actual code, succeeding to the firstly appeared "1", are masked.

In the comparing circuit 10, the 7 bits which succeed to the "1" firstly appearing in the shift register 1 and which are masked by the mask circuit 9, are compared with the 7 bits of the tag value which are outputted from the cache memory 8 and which are masked by the mask circuit 9. When coincidence is obtained, the comparator 101 outputs a control signal indicative of a line hit. The value of the control signal outputted from the comparator 101 and the value of the valid bit (V) (one bit) outputted from the cache memory 8, are supplied to the AND gate 102 in the comparing circuit 10. Thus, the AND gate 102 executes the logical AND, and outputs the result of the logical AND, as a control signal indicative of a cache hit only when the control signal outputted from the comparator 101 is indicative of the line hit and the valid bit value (V) is indicative of the valid. Otherwise, the AND gate 102 outputs a control signal indicative of a mishit.

Returning to FIG. 1, when the control signal outputted from the comparing circuit 10 is indicative of the cache hit, the control circuit 11 selects and outputs the 10 bits in total outputted from the cache memory 8, including the 6 bits indicative of the run length (RL), the one bit (T/M) indicative of the terminate code/makeup code information, and the three bits indicative of the number of the remaining bits in the actual code, succeeding to the firstly appeared "1". When the control signal outputted from the comparing circuit 10 is indicative of the mishit, the control circuit 11 selects and outputs the 10-bit data outputted from the ROM 5, and then, writes the 10-bit data outputted from the ROM 5, into the line in the cache memory designated by the four bits in total composed of the 3 bits of the zero count register 4 and the one bit of the white/black register 2. Furthermore, the control circuit 11 registers the most significant 7 bits of the output of the shift register 1, to the tag of the selected line, and sets the valid bit (V) of the selected line. These values registered and set in the cache memory are used at a next and succeeding accesses to the cache memory 8.

Of the 10-bit data outputted from the control circuit 11 (RL, T/M, and the number of the remaining bits in the actual code, succeeding to the firstly appeared "1"), the run length of 6 bits and the T/M bit of one bit are supplied in parallel together with one bit of the white/black register 2, to the image generating circuit 12. This data is restored into a image signal by the image generating circuit 12, and the restored image signal is serially supplied to the FIFO memory 13. Here, when the value of the T/M bit indicates M (makeup code), the value of the run length is multiplied by 64. On the other hand, when the value of the T/M bit indicates T (terminate code), the value of the run length is outputted as it is and the content of the while/black register is inverted.

Furthermore, the bits indicative of the number of the remaining bits in the actual code, succeeding to the firstly appeared "1", are outputted from the control circuit 11, and are selected by the selector 6 to be supplied to the shifter 7. The number of the remaining bits in the actual code, succeeding to the firstly appeared "1", becomes information which determine a heading position of a code to be next decoded. Namely, the shifter 7 leftward shifts the content of the shift register 1 by the number of the remaining bits in the actual code, succeeding to the firstly appeared "1", so that new code bits are inputted into the shift register 1 by the shifted number. Thus, the code to be next decoded is set in the shift register 1. The above mentioned operation is repeated for the decoding until the code becomes not inputted.

For example, in the decoding system shown in FIG. 1, when the "black 16" (code="0000010111") is decoded, the value of the zero count register 4 is "101" (=5), the value of the white/black register 2 is "1" indicative of black, and the code of the 7 bits succeeding to the firstly appeared "1", is "0111XXX (where "XXX" is a portion of a next code succeeding to the code of the "black 16" in the code sequence).

Therefore, the address (index) supplied to the cache memory 8 is "1011", since it is composed of four bits in total including the three bits of the zero count register 4 and the one bit of the while/black register 2. Since the tag is the code of the 7 bits succeeding to the firstly appeared "1", it become "0111XXX". In this case, since this is a heading one of the code sequence, the cache memory 8 is mishit, and the data (run length, T/M bit, and the number of the remaining bits in the actual code, succeeding to the firstly appeared "1") is read out from the ROM 5. This data is stored in a data storing region of the "1011"th line in the cache memory 8. Simultaneously, "0111XXX" is stored in the tag of the "1011"th line, and the valid bit (V) of the "1011"th line is set.

In succeeding accesses, when the code of the "black 16" is inputted, the code of the 7 bits succeeding to the firstly appeared "1" stored in the shift register 1 is "0111YYY" (where "YYY" is a portion of a next code succeeding to the code of the second "black 16" in the code sequence). "1011" is supplied to the cache memory 8 as an address (index), and the stored "0111XXX" is outputted as the tag value. Here, since the number of the remaining bits in the actual code, succeeding to the firstly appeared "1" is 4, "100"(=4) is inputted to the mask value generating circuit 91, which then outputs the mask value "1111000".

The mask value of 7 bits of "1111000" and the tag value of the 7 bits of "0111XXX" outputted from the cache memory 8 are supplied to the AND gate 92, which execute the logical AND to output "0111000". On the other hand, the mask value of 7 bits mask value of 7 bits of "1111000" and the code bits of the 7 bits of "0111YYY" in the actual code, succeeding to the firstly appeared "1" in the MH code sequence, are supplied to the AND gate 93, which execute the logical AND to output "0111000".

In the comparing circuit 10, the 7 bits of "0111000" which succeed to the "1" firstly appearing in the shift register 1 and which are masked by the mask circuit 9, are compared with the 7 bits of "0111000" of the tag value which are outputted from the cache memory 8 and which are masked by the mask circuit 9. In this case, since coincidence is obtained, the comparator 101 outputs a control signal indicative of a line hit. In addition, the valid bit value (V) in the selected line of the cache memory 8 is set to indicate the valid. Referring to FIG. 2, since the control signal outputted from the comparator 101 is indicative of the line hit and the valid bit value (V) is indicative of the valid, the comparing circuit 10 outputs a control signal indicative of a cache hit As mentioned above, even if the 7 bits succeeding to the "1" firstly appearing in the shift register 1 are different from the content of the tag of the cache memory 8, if they are coincident to each other in only a limited range corresponding to the remaining bits in the actual code, succeeding to the firstly appeared "1", the cache memory can be hit. Therefore, the hit rate can be elevated.

Figure 3:
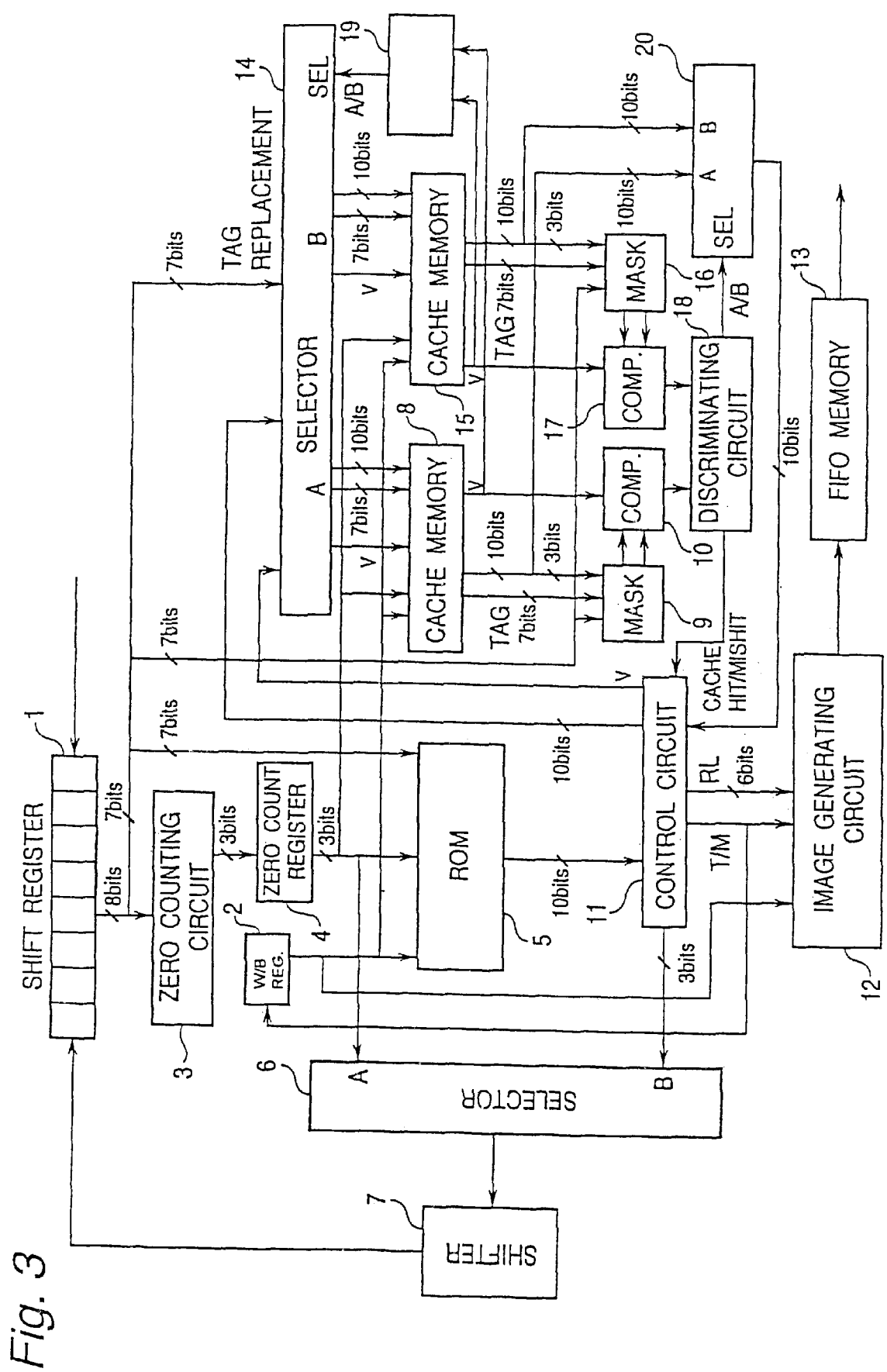
FIG. 3 is a block diagram of another embodiment of the variable length code decoding system in accordance with the present invention.

Referring to FIG. 3, there is shown a block diagram of another embodiment of the variable length code decoding system in accordance with the present invention. The second embodiment is characterized in that the cache memory is constructed in the form of an associative memory, which is divided into two units. In FIG. 3, elements corresponding to those shown in FIGS. 1 and 2 are given the same reference numbers and explanation will be omitted.

A cache memory 15 has the same construction as that of the cache memory 8, and comprises 16 lines, each of which is constituted of a tag, a valid bit (V), and data (run length, T/M bit, and the number of the remaining bits in the actual code, succeeding to the firstly appeared "1"). A mask circuit 16 has the same construction as that of the mask circuit 9. The mask circuit 16 receives the code bits of 7 bits succeeding to the "1" firstly appearing in the shift register 1, 7 bits of a tag value outputted from the cache memory 15, and a portion of the data outputted from the cache memory 15, indicating the number of remaining bits succeeding to the firstly appeared "1" in the actual code. The mask circuit 16 outputs the most significant 7 bits of the output of the shift register 1 in which the bits other than the remaining bits succeeding to the firstly appeared "1" in the actual code are masked, and the 7 bits of the tag value outputted from the cache memory 15, in which the bits other than the remaining bits succeeding to the firstly appeared "1" in the actual code are masked.

A comparing circuit 17 has the same construction as that of the comparing circuit 10. The comparing circuit 17 receives and compares the most significant 7 bits of the output of the shift register 1, masked by the mask circuit 16, and the 7 bits of the tag value outputted from the cache memory 15, masked by the mask circuit 16. Only when coincidence is obtained and when a valid bit value V of one bit outputted from the cache memory 15 indicates the valid, the comparing circuit 17 outputs a control signal indicative of a cache hit to a discriminating circuit 18. Otherwise, the comparing circuit 17 outputs a control signal indicative of a mishit The discriminating circuit 18 outputs a control signal indicative of a cache hit to the control circuit 11 when either the control signal of the comparing circuit 10 or the control signal of the comparing circuit 17 indicates the cache hit. Simultaneously, the discriminating circuit 18 outputs a selection signal indicative of which of the cache memory 8 and the cache memory 17 is hit, to a selector 20. This selector 20 selects the data outputted from the hit cache, from among the 10-bit data outputted from the cache memory 8 and the 10-bit data outputted from the cache memory 15, and outputs the selected data to the control circuit 11.

When both the control signals outputted from the comparing circuits 10 and 17 indicates the mishit, the discriminating circuit 18 outputs the control signal of a mishit to the control circuit 11 neither the cache memory 8 nor the cache memory 17 is hit, A selecting circuit 19 receives the valid bit (V) outputted from the cache memory 8 and the valid bit (V) outputted from the cache memory 15. If either the valid bit (V) outputted from the cache memory 8 or the valid bit (V) outputted from the cache memory 15 is indicative of the invalid, the selecting circuit 19 outputs to the selector 14, a control signal for selecting the cache memory having the valid bit (V) indicative of the invalid. On the other hand, if both of the valid bit (V) outputted from the cache memory 8 and the valid bit (V) outputted from the cache memory 15 are indicative of the valid, the selecting circuit 19 outputs to the selector 14, a control signal for forcibly selecting one of the cache memory 8 and the cache memory 15.

When the control signal outputted from the discriminating circuit 19 is indicative of the mishit, the control circuit 11 selects the 10-bit data outputted from the ROM, and outputs the selected data to the selector 14.

The selector 14 is controlled by the control signal outputted from the selecting circuit 19, to select either the cache memory 8 or the cache memory 15. In the selected cache memory 8, the 10-bit data outputted from the ROM is written through the selector 14 to the line designated by the four bits in total comprising the three bits of the zero count register 4 and the one bit of the white/black register 2. Furthermore, in the selected cache memory, the most significant 7 bits of the output of the shift register 1 is registered in the tag of the designated line into which the data has been written, and also, the valid bit (V) of the designated line is set. These values are used in a next and succeeding accesses to the cache memories.

In the second embodiment as mentioned above, the cache memory is constructed in the form of the associative memory having two units. Therefore, the decoded data accessed by the same index (the four bits in total comprising the three bits of the zero count register 4 and the one bit of the white/black register 2) can be stored in an empty cache memory of the two units of cache memory. Accordingly, the hit rate of the cache memory can be further elevated.

Furthermore, the second embodiment is the variable length code decoding system having two units of cache memory, but can be applied to a variable length code decoding system having three, four or more units of cache memory.

As seen from the above, the following advantages can be obtained in accordance with the present invention.

A first advantage is to elevate the hit rate of the cache memory since the cache is hit without exception if the decoded data exists in the cache memory.

The reason for this is as follows. When the decoding is carried out by accessing the cache memory by using a variable length code as an address, whether the cache memory is hit or mishit is judged by discriminating whether or not the code bits of the 7 bits succeeding to the firstly appeared "1" in the actual code is coincident with the tag stored in the cache memory. The comparison is carried out by masking bits other than an effective bit length of the actual code, by utilizing the three-bit information indicating the number of remaining bit in the actual code, succeeding to the firstly appeared "1", outputted from the cache memory.

A second advantage is to further elevate the hit rate of the cache memory if the cache memory is constructed in the form of the associative memory having at least two units.

The reason of this is that, the decoded data accessed by the same index (the four bits in total comprising the three bits of the zero count register and the one bit of the white/black register) can be stored in an empty cache memory of the at least two units of cache memory.

The invention has thus been shown and described with reference to the specific embodiments. However, it should be noted that the present invention is in no way limited to the details of the illustrated structures but changes and modifications may be made within the scope of the appended claims.

What is claimed is:

1. A variable length code decoding system having a cache memory and so configured to execute a decoding by accessing said cache memory by using a variable length code as an address, the system comprising a hit/mishit discriminating means for discriminating whether or not said cache is hit, by comparing said address with a tag read out from said cache memory in only a limited range corresponding to an effective code length of the variable length code, Said hit/mishit discriminating means includes a mask circuit and a comparing circuit, said mask circuit receiving code bits of 7 bits succeeding to a firstly appeared "1" in a modified Huffman code sequence, a tag value of 7 bits outputted from said cache memory, and a number of remaining bits in an actual code, succeeding to said firstly appeared "1", which is a portion of data outputted from said cache memory, said mask circuit outputting said code bits of 7 bits succeeding to said firstly appeared "1" and having bits which are other than said remaining bits in the actual code and which are masked by said mask circuit, and said tag value of said 7 bits outputted from said cache memory and having bits which are other than said remaining bits in the actual code and which are masked by said mask circuit, said comparing circuit receiving and comparing said code bits of 7 bits having the bits masked by said mask circuit and said tag value of said 7 bits having the bits masked by said mask circuit, said comparing circuit outputting a control signal indicative of a cache hit only when coincidence is obtained in the comparison and a valid bit outputted from said cache memory is indicative of valid, said comparing circuit otherwise outputting a control signal indicative of a mishit.

2. A variable length code decoding system claimed in claim 1, wherein said mask circuit includes a mask value generating circuit and first and second logical AND circuits, said mask value generating circuit receiving the number of remaining bits in the actual code, succeeding to said firstly appeared "1", and outputting a mask value of 7 bits for masking said bits which are other than said remaining bits in the actual code, said first logical AND circuit receiving said mask value of 7 bits and said tag value of said 7 bits outputted from said cache memory, for outputting said tag value of said 7 bits having said bits which are other than said remaining bits in the actual code and which are masked by said mask circuit, and said second logical AND circuit receiving said mask value of 7 bits and said code bits of 7 bits succeeding to said firstly appeared "1" in said modified Huffman code sequence, for outputting said code bits of 7 bits having said bits which are other than said remaining bits in the actual code and which are masked by said mask circuit.

3. A variable length code decoding system claimed in claim 2, wherein said comparing circuit includes a comparator and a logical AND gate, said comparator comparing said code bits of 7 bits having said bits masked by said mask circuit and said tag value of said 7 bits having said bits masked by said mask circuit, for outputting a control signal indicative of a line hit when coincidence is obtained, said logical AND gate receiving said control signal from said comparator and said valid bit outputted from said cache memory, for outputting said control signal indicative of said cache hit only when said control signal from said comparator is indicative of the line hit and said valid bit is indicative of the valid, said logical AND gate otherwise outputting said control signal indicative of the mishit.

4. A variable length code decoding system having a cache memory and so configured to execute a decoding by accessing said cache memory by using a variable length code as an address, the system comprising a hit/mishit discriminating means for discriminating whether or not said cache is hit, by comparing said address with a tag read out from said cache memory in only a limited range corresponding to an effective code length of the variable length code, said cache memory includes a plurality of cache memories, and said hit/mishit discriminating means includes a mask circuit and a comparing circuit provided for each of said plurality of cache memories, each mask circuit receiving code bits of 7 bits succeeding to a firstly appeared "1" in a modified Huffman code sequence, a tag value of 7 bits outputted from a corresponding cache memory, and a number of remaining bits in an actual code, succeeding to said firstly appeared "1", which is a portion of data outputted from said corresponding cache memory, each mask circuit outputting said code bits of 7 bits having bits which are other than said remaining bits in the actual code and which are masked by said mask circuit, and said tag value of said 7 bits having bits which are other than said remaining bits in the actual code and which are masked by said mask circuit, each comparing circuit receiving and comparing said code bits of 7 bits having the bits masked by the corresponding mask circuit and said tag value of said 7 bits having the bits masked by the corresponding circuit, each comparing circuit outputting a control signal indicative of a cache hit only when coincidence is obtained in the comparison and a valid bit outputted from said corresponding cache memory is indicative of said comparing circuit otherwise outputting a control signal indicative of a mishit, and wherein said system further includes:

control circuit;

a shift register receiving said modified Huffman code sequence;

a zero detecting means for detecting the number of continuing "0"s, which is seven at maximums before said firstly appeared "1" appears in said modified Huffman code sequence, said zero detecting means outputting three bits indicative of the number of continuing "0"s thus detected;

a decoding conversion ROM receiving, as an address input, 11 bits in total comprising said three bits indicative of the number of continuing "0"s, said code bits of 7 bits succeeding to said firstly appeared "1", and one bit indicative of a color of white or black of an image to be decoded, said decoding conversion ROM outputting 10 bits in total comprising 6 bits indicative of the run length to be actually decoded, one bit indicative of which of a terminate code and a makeup code the code under decoding is, and the three bits indicative of the number of remaining bits in the actual code, succeeding to said firstly appeared "1";

a discriminating circuit receiving said control signal from each comparing circuit, said discriminating circuit outputting to sad control circuit, a second control signal indicative of a cache hit when any of said comparing circuits outputs said first mentioned control signal indicative of the cache hit and a discriminating signal indicative of which of said plurality of cache memories is hit, said discriminating circuit outputting said second control signal indicative of a mishit to said control circuit when none of said comparing circuits outputs said first mentioned control signal indicative of the cache hit;

a first selector receiving said discriminating signal for selecting, among 10-bit data respectively outputted from said plurality of cache memories, said 10-bit data outputted from a hit cache memory in accordance with said discriminating signal, said first selector outputting said selected 10-bit data;

a selecting circuit receiving a valid bit outputted from each of said plurality of cache memories, said selecting circuit outputting a selection control signal for selecting a cache memory outputting said valid bit indicative of invalid when any of the received valid bits is indicative of invalid, and selecting circuit outputting the selection control signal for forcibly selecting any of said plurality of cache memories when all of the received valid bits are indicative of valid; and a second selector receiving said selection control signal for selecting one of said plurality of cache memories in accordance with said selection control signal, so that when said second control signal outputted from said discriminating circuit indicates the mishit, said control circuits selects the 10 bit data from said decoding conversion ROM, and outputs the selected 10-bit data to said second selector, and said selected 10-bit data is written through said second selector into said cache memory selected by said second selector at a line of said selected cache memory designated by four bits in total including said three bits outputted from said zero detecting means and said one bit indicative of the color of white or black, most significant 7 bits of an output of said shift register being registered into a tag of said line written with said selected 10-bit data, and the valid bit in said line written with said selected 10-bit data being set, whereby these values are used in a next and succeeding accesses to said cache memories.

* * * * *